(12) United States Patent
Mabuchi

(10) Patent No.: US 7,787,038 B2
(45) Date of Patent: Aug. 31, 2010

(54) SOLID-STATE IMAGE PICKUP DEVICE AND DRIVING METHOD THEREFOR

(75) Inventor: Keiji Mabuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 1405 days.

(21) Appl. No.: 10/673,775

(22) Filed: Sep. 29, 2003

(65) Prior Publication Data

US 2004/0130641 A1  Jul. 8, 2004

(30) Foreign Application Priority Data

Oct. 4, 2002  (JP)  ............................ P2002-291962

(51) Int. Cl.
*H04N 3/14* (2006.01)
*H04N 5/335* (2006.01)

(52) U.S. Cl. ..................... 348/302; 250/208.1

(58) Field of Classification Search ............. 348/220.1, 348/241, 294–324, 372; 257/223, 233; 250/208.1
See application file for complete search history.

(56) References Cited

U.S. PATENT DOCUMENTS

| | | | | |
|---|---|---|---|---|
| 5,587,596 A | * | 12/1996 | Chi et al. | ..................... 257/223 |
| 5,729,287 A | * | 3/1998 | Morimoto | ..................... 348/241 |
| 5,747,840 A | * | 5/1998 | Merrill | ..................... 257/233 |
| 6,486,460 B1 | * | 11/2002 | Murakami et al. | ........ 250/208.1 |
| 6,501,109 B1 | * | 12/2002 | Chi | ............................. 257/223 |
| 6,661,459 B1 | * | 12/2003 | Koizumi et al. | ............. 348/310 |
| 6,825,878 B1 | * | 11/2004 | Rhodes | ....................... 348/308 |
| 6,982,751 B1 | * | 1/2006 | Tanaka | ..................... 348/220.1 |
| 7,102,680 B2 | * | 9/2006 | Mori et al. | ................... 348/314 |
| 7,129,985 B1 | * | 10/2006 | Koizumi et al. | ............. 348/372 |

(Continued)

FOREIGN PATENT DOCUMENTS

JP  58-125974  7/1983

(Continued)

OTHER PUBLICATIONS

Japanese Office Action issued on Nov. 10, 2006.

(Continued)

*Primary Examiner*—Jason Whipkey
*Assistant Examiner*—Dennis Hogue
(74) *Attorney, Agent, or Firm*—Sonnenschein Nath & Rosenthal LLP

(57) ABSTRACT

A CMOS image sensor is disclosed which can achieve reduction of the voltage used to read out signal charge and can achieve expansion of the dynamic range. A P-well region is formed on a semiconductor substrate, and an embedded photodiode, a transfer transistor, an amplification transistor, a selection transistor, a reset transistor, a floating diffusion and so forth are provided in the P-well region. Signal charge of the photodiode is transferred to the floating diffusion by operation of the transfer transistor. A substrate bias voltage in the form of a negative voltage is applied to the P-well region in synchronism with the charge transfer operation of the transfer transistor to control the potential balance between the photodiode and the transfer gate portion to reduce the voltage for charge transfer. Further, during charge storage of the photodiode, the substrate bias voltage is varied to modify the angle of the sensitivity curve to achieve expansion of the dynamic range.

18 Claims, 12 Drawing Sheets

U.S. PATENT DOCUMENTS

| | | | |
|---|---|---|---|
| 7,375,752 B2 * | 5/2008 | Raynor et al. | 348/308 |
| 2003/0030737 A1 * | 2/2003 | Yanai | 348/296 |

FOREIGN PATENT DOCUMENTS

| | | |
|---|---|---|
| JP | 01-122260 | 5/1989 |
| JP | 03-195278 | 8/1991 |
| JP | 4-32589 | 5/1992 |
| JP | 10-248035 | 9/1998 |
| JP | 2000-022126 | 1/2000 |
| JP | 2000022126 A * | 1/2000 |
| JP | 2000-092395 | 3/2000 |
| JP | 2001-257940 | 9/2001 |

OTHER PUBLICATIONS

Japanese Office Action issued on Mar. 16, 2010 in connection with corresponding JP Application No. 2007-001459.

* cited by examiner

F I G. 4
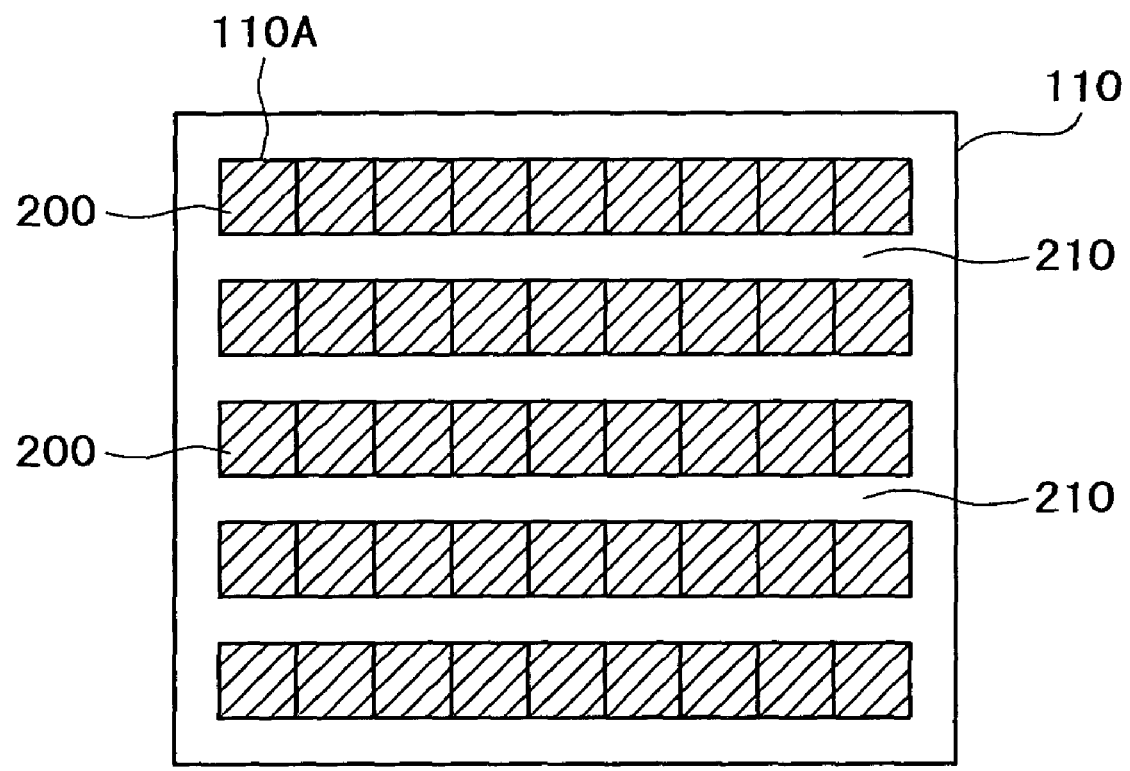

SOLID-STATE IMAGE PICKUP DEVICE AND DRIVING METHOD THEREFOR

BACKGROUND OF THE INVENTION

This invention relates to a solid-state image pickup device such as, for example, a MOS type image sensor or a CCD type image sensor and a driving method for the solid-state image pickup device, and more particularly to a configuration of a solid-state image pickup device for achieving reduction of the voltage or expansion of the dynamic range when signal charge produced by a photo-electric conversion element is read out.

FIGS. 11 and 12 show an example of a pixel structure in a conventional CMOS type image sensor, and particularly FIG. 11 is a circuit diagram showing an example of a configuration of a pixel circuit and FIG. 12 is a sectional view showing a structure of some elements of the pixel circuit of FIG. 11.

Here, the CMOS type image sensor is a kind of MOS type image sensor and is called as such because a CMOS-LSI process is applied to form the elements thereof and so forth. However, the CMOS type image sensor need not necessarily be formed fully using a CMOS-LSI process but may partially include some process unique to the image sensor.

The configuration of the pixel circuit is first described with reference to FIG. 11.

According to the pixel circuit shown, each pixel includes a photodiode (PD) 10 and four pixel transistors (Tr) 11, 12, 13 and 14 for transfer, amplification, selection and resetting, respectively.

The photodiode 10 stores electrons produced by photoelectric conversion. The transfer transistor 11 transfers the electrons of the photodiode 10 to a floating diffusion (FD) 15.

The amplification transistor 12 is connected at the gate thereof to the floating diffusion 15 and converts a potential variation of the floating diffusion 15 into an electric signal. The selection transistor 13 selects a pixel from which a signal is to be read out in a unit of a row. When the selection transistor 13 is turned on, the amplification transistor 12 and a constant current source 17 which is connected to a vertical signal line 16 outside the pixel cooperatively form a source follower, and consequently, a voltage which varies in response to the voltage of the floating diffusion 15 is outputted to the vertical signal line 16.

The reset transistor 14 resets the potential of the floating diffusion 15 to a power supply potential Vdd.

FIG. 12 shows a sectional structure of the pixel circuit of FIG. 11 in a region from the photodiode 10 to the floating diffusion 15 through the gate part of the transfer transistor 11.

Referring to FIG. 12, the photodiode 10, a gate portion 11A of the transfer transistor 11 and the floating diffusion 15 are provided in a P-well region 20A formed on a silicon substrate 20, and a gate oxide film or gate insulating film 21 is formed on the silicon substrate 20. An element isolating region 22 of LOCOS is formed at part of the gate oxide film 21.

A transfer gate electrode 11B of the transfer transistor 11 is formed on the gate oxide film 21.

For the photodiode 10, a known embedded photodiode may be used. Where an embedded photodiode is applied, for example, to the photodiode formed in the P-well region 20A, a portion of the silicon substrate 20 in the proximity of an interface of the gate oxide film 21 is formed as a p+ layer or charge separation region 10A and an n layer or charge storage region 10B for storing photoelectrons is formed below the p+ layer 10A to store charge in the deep portion of the silicon substrate 20.

With the embedded photodiode having the configuration just described, since the interface of the n layer 10B is covered with the p+ layer 10A, dark current which may otherwise be generated in the interface of the n layer 10B can be prevented.

Further, if the transfer transistor 11 and the photodiode 10 are designed appropriately, then all photoelectrons of the photodiode 10 can be transferred to the floating diffusion 15. Therefore, the structure of the embedded photodiode 10 described above is used widely in CCD type sensors, and a photodiode having a structure called HAD (Hole Accumulation Diode) structure is provided.

Since the transistors are produced by an ordinary CMOS process, a side wall 11C as a spacer is formed from a silicon oxide film or the like on the transfer gate electrode 11B.

The n layer 10B of the photodiode 10 is formed by ion implantation through self alignment using the transfer gate electrode 11B before the side wall 11C is formed after the transfer gate electrode 11B is formed.

The p+ layer 10A of the photodiode 10 is thereafter formed by ion implantation through self alignment using the side wall 11C after the side wall 11C is formed.

The reason why the n layer 10B and the p+ layer 10A of the photodiode 10 are formed in this manner is that it is intended to assure a very small distance between the p+ layer 10A and the transfer gate electrode 11B with certainty to facilitate transfer of photoelectrons of the photodiode 10.

Meanwhile, the floating diffusion 15 has an LDD structure similarly to an ordinary transistor. According to the LDD structure, an n layer (LDD layer) having a low impurity concentration is formed just below the side wall 11C of the transfer gate portion 11A and an n+ layer (NSD layer) having a high impurity concentration is formed at a distance corresponding to the side wall 11C from the transfer gate portion 11A.

The inventors of the present invention have proposed that, in a solid-state image pickup device having such a structure as described above, a negative voltage of −1 V or the like (here it is called transfer bias voltage) is applied to the transfer gate electrode 11B to suppress dark current (current composed of electrons flowing into the photodiode even if no light is inputted) from the interference below the transfer gate portion 11A.

This is because, where the transfer gate electrode 11B is biased to the negative voltage, a p-type channel 11D is formed in the interface of the gate oxide film 21 below the gate portion 11A and prevents dark current from the interference level similarly to the embedded photodiode 10.

Further, as a method of expanding the dynamic range in a sold-state image pickup device of the type described, a method is known wherein the voltage to the transfer gate or the reset gate is varied during a storage period as disclosed, for example, in Japanese Patent Laid-Open No. Hei 10-248035 (hereinafter referred to as patent document 1).

Incidentally, the pixel configuration described above with reference to FIGS. 11 and 12 has a problem in that the gate voltage necessary to transfer photoelectrons of the photodiode 10 cannot be reduced below a fixed level and therefore it is difficult to reduce the voltage for the CMOS sensor.

In particular, in order for the photodiode 10 to store a required number of electrons, a full depletion voltage of, for example, 1.5 V or more is required. Further, in order to read out all of the electrons of the photodiode 10, when the transfer gate is turned on, a channel having a potential equal to or higher than 1.5 V must be produced at a location deeper than the interference of the gate oxide film 21 so that it may smoothly connect to the n layer of the photodiode 10.

From this reason, there is a problem that, in order to achieve full transfer of the electrons, the gate voltage cannot be set, for example, lower than 2.7 V. This problem is the reverse phase to the problem that, where the same gate voltage is used, it is difficult to transfer photoelectrons of the photodiode to a deeper potential and consequently the number of electrons for saturation is small, that is, it is impossible to assure a sufficient dynamic range. Particularly for a CMOS sensor, a low voltage of 2.5 V or 1.8 V is demanded. However, it is always a subject to be solved how the number of saturation electrons should be increased.

It is to be noted that the subjects described above (reduction of the voltage for the transfer gate and to increase the number of electrons which can be transferred with an equal voltage) are involved similarly as far as a transfer element for receiving a voltage as an input to control the potential is used also where the photodiode is not of the embedded type and where not a photodiode but a photogate is adopted.

The method disclosed in the patent document 1 has the following problems.

First, where the voltage to the transfer gate is varied during a storage period, if a high voltage is inputted to the transfer gate, then when the light amount is great, the photodiode and the floating diffusion are rendered conducting. Therefore, there is a limitation to the operation range.

On the other hand, where the voltage to the reset gate is varied during a storage period, since photoelectrons are stored into a node having a contact such as a floating diffusion, dark current is higher when compared with that where photoelectrons are stored into an embedded photodiode.

SUMMARY OF THE INVENTION

It is an object of the present invention to provide a solid-state image pickup device and a driving method therefor which can achieve reduction of the voltage used to read out signal charge produced in a photoelectric conversion element and can achieve expansion of the dynamic range.

According to the first aspect of the present invention, there is provided a solid-state image pickup device, including:
  a plurality of photoelectric conversion sections provided in a semiconductor layer;
  a transfer switch provided adjacent the photoelectric conversion sections in the semiconductor layer for transferring charge from the photoelectric conversion sections; and
  means for applying a predetermined voltage to the semiconductor layer within a period which includes at least part of a transfer period of the transfer switch.

According to the second aspect of the present invention, there is provided a solid-state image pickup device, including:
  a semiconductor substrate having a well region formed thereon;
  a photoelectric conversion element formed in the well region for receiving light and producing signal charge in accordance with an amount of the received light;
  a readout section formed in the well region for reading out the signal charge produced by the photoelectric conversion element at a predetermined readout timing; and
  voltage control means for applying a predetermined substrate bias voltage to the well region upon reading out of the signal charge by the readout section.

According to the third aspect of the present invention, there is provided a solid-state image pickup device, including:
  a semiconductor substrate having a well region formed thereon;
  a photoelectric conversion element formed in the well region for receiving light and producing signal charge in accordance with an amount of the received light;
  a readout section formed in the well region for reading out the signal charge produced by the photoelectric conversion element at a predetermined readout timing; and
  voltage control means for applying a substrate bias voltage to the well region and changing the substrate bias voltage during a storage period of the signal charge by the photoelectric conversion element.

According to the fourth aspect of the present invention, there is provided a driving method for a solid-state image pickup device wherein a photoelectric conversion element for receiving light and producing signal charge in accordance with an amount of the received light and a readout section for reading out the signal charge produced by the photoelectric conversion element at a predetermined readout timing are provided in a well region formed on a semiconductor substrate, including
  a step of applying a predetermined substrate bias voltage to the well region upon reading out of the signal charge by the readout section.

According to the fifth aspect of the present invention, there is provided a driving method for a solid-state image pickup device wherein a photoelectric conversion element for receiving light and producing signal charge in accordance with an amount of the received light and a readout section for reading out the signal charge produced by the photoelectric conversion element at a predetermined readout timing are provided in a well region formed on a semiconductor substrate, including
  a step of applying a substrate bias voltage to the well region and changing the substrate bias voltage during a storage period of the signal charge by the photoelectric conversion element.

The above and other objects, features and advantages of the present invention will become apparent from the following description and the appended claims, taken in conjunction with the accompanying drawings in which like parts or elements denoted by like reference symbols.

BRIEF DESCRIPTION OF THE DRAWINGS

FIG. 4 is a schematic plan view showing a configuration of P-well regions below a pixel section according to a first example of the solid-state image pickup device of FIG. 1;

FIG. 12 is a cross sectional view showing a photodiode and neighboring elements of the solid-state image pickup device of FIG. 11.

DESCRIPTION OF THE PREFERRED EMBODIMENTS

A solid-state image pickup device described below to which the present invention is applied is generally configured such that, in order to reduce the voltage to be used to transfer signal charge of a photoelectric conversion element in the form of a photodiode to a floating diffusion using a signal readout section in the form of a transfer gate, a substrate bias voltage is applied to a P-well region provided in a lower layer of a pixel in synchronism with transfer of the charge. The readout voltage can be reduced thereby.

Further, the substrate bias voltage applied to the P-well region is varied during a charge storage period of the photodiode to expand the dynamic range.

The principles of them are hereinafter described in detail.

Figure 1:
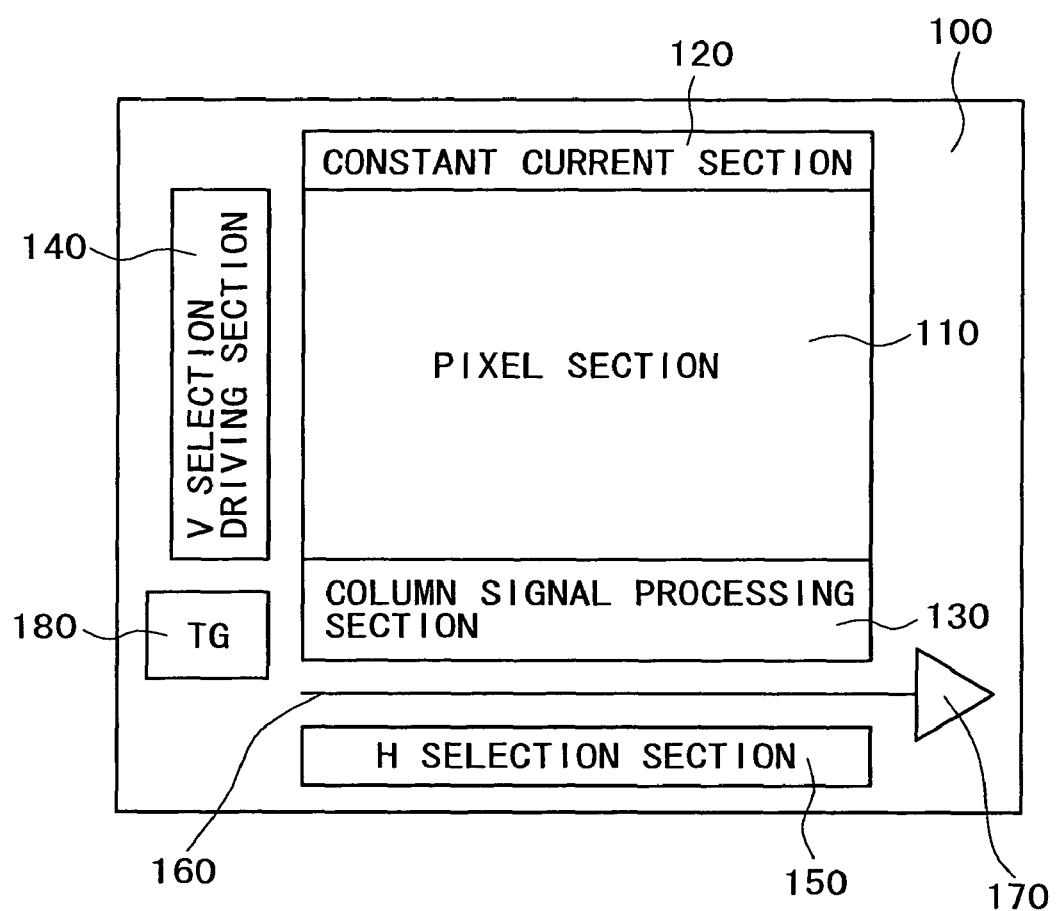
FIG. 1 is a block diagram showing an example of a general configuration of a solid-state image pickup device to which the present invention is applied.

FIG. 1 shows an example of a general configuration of a solid-state image pickup device to which the present invention is applied and particularly shows an example of a solid-state image pickup device in the form of a CMOS type image sensor.

Referring first to FIG. 1, the solid-state image pickup device shown includes a pixel section or image pickup region section 110, a constant current section 120, a column signal processing section or column section 130, a vertical (V) selection driving section 140, a horizontal (H) selection section 150, a horizontal signal line 160, an output processing section 170, a timing generator (TG) 180 and other required components all provided on a semiconductor element substrate 100.

Figure 2:
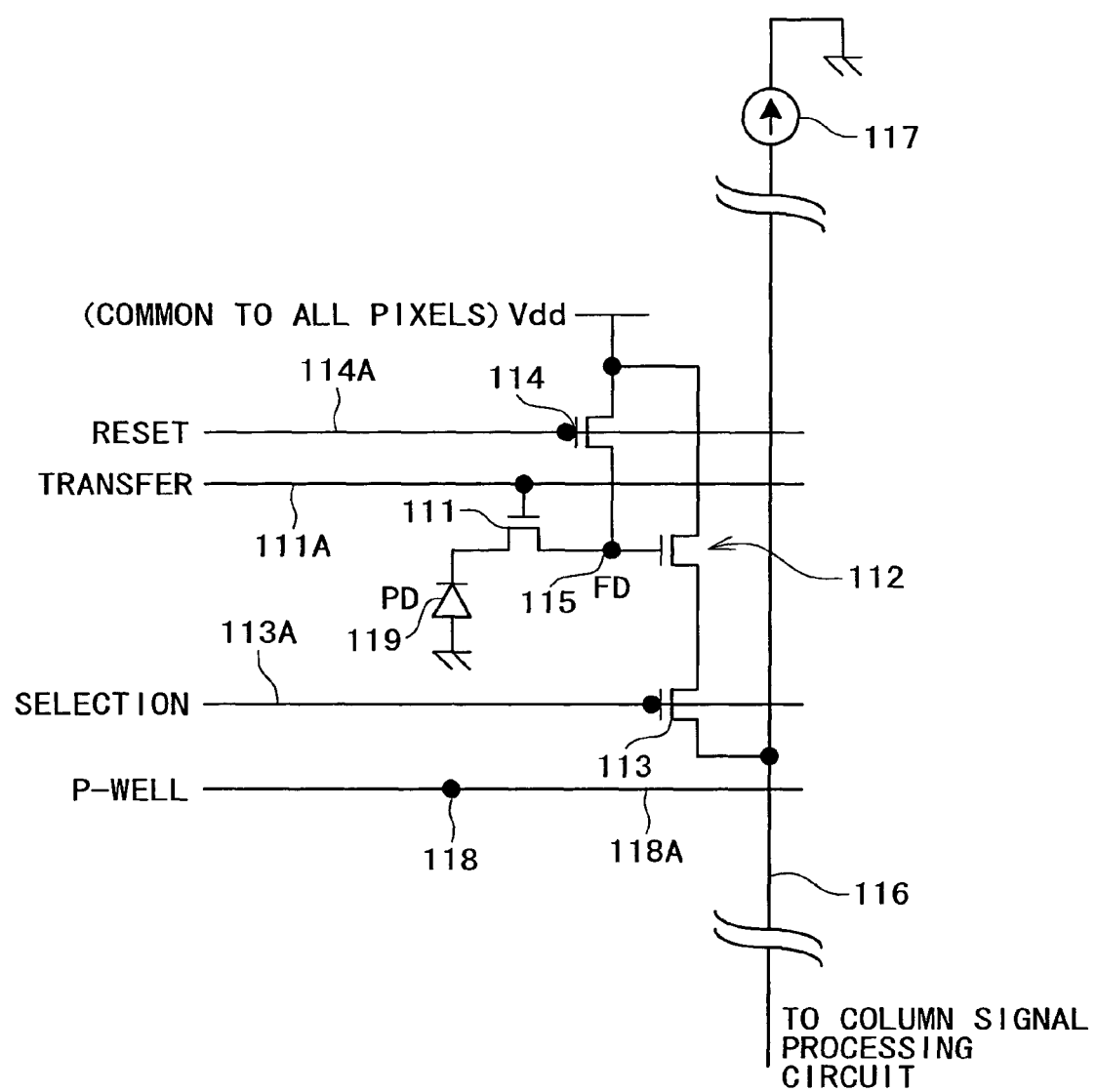
FIG. 2 is a circuit diagram showing an example of a configuration of a pixel circuit employed in the solid-state image pickup device of FIG. 1.

The pixel section 110 includes a large number of pixels arranged in a two-dimensional matrix and includes such a pixel circuit as shown in FIG. 2 for each of the pixels. Signals of the pixels from the pixel section 110 are outputted to the column signal processing section 130 for each pixel column through a vertical signal line (not shown in FIG. 1).

The constant current section 120 includes a constant current source (not shown in FIG. 1) disposed for each pixel column for supplying bias current to the pixels of the pixel column.

The vertical selection driving section 140 successively selects the pixels of the pixel section 110 for every one row to control a shutter operation or a readout operation of the pixels.

The column signal processing section 130 successively receives signals of the pixels obtained through the vertical signal lines for every one row, performs a predetermined signal process for the signals for every column and temporarily stores the processed signals. In this instance, the column signal processing section 130 suitably performs, for example, a CDS process for removing fixed pattern noise originating from some dispersion in threshold value of a pixel transistor, an AGC (Automatic Gain Control) process and an A/D conversion process.

The horizontal selection section 150 selects the signals of the column signal processing section 130 one by one and introduces the selected signal to the horizontal signal line 160.

The output processing section 170 performs a predetermined process for the signal from the horizontal signal line 160 and outputs a resulting signal to the outside. To this end, the output processing section 170 may include, for example, a gain control circuit and a color processing circuit not shown. It is to be noted that the A/D conversion may be performed not by the column signal processing section 130 but by the output processing section 170.

The timing generator 180 produces and supplies various pulse signals and like signals necessary for operation of the components of the solid-state image pickup device in response to a reference clock.

Referring now to FIG. 2, there is shown an example of a configuration of one of the pixel circuits of the solid-state image pickup device of FIG. 1.

The pixel circuit shown is provided for each of the pixels of the solid-state image pickup device and includes a photodiode (PD) 119, and four pixel transistors (Tr) 111, 112, 113 and 114 provided for transfer, amplification, selection and resetting, respectively.

The photodiode 119 stores electrons produced by photoelectric conversion and transfers the stored electrons to a floating diffusion 115 when the transfer transistor 111 is turned on. Since the floating diffusion 115 has parasitic capacitance, photoelectrons are cumulatively stored into the floating diffusion 115.

The amplification transistor 112 is connected at the gate thereof to the floating diffusion 115 and converts a potential variation of the floating diffusion 115 into an electric signal. The selection transistor 113 selects the pixel from which a signal is to be read out in a unit of a row. If the selection transistor 113 is turned on, then the amplification transistor 112 and a constant current source 117 which is connected to a vertical signal line 116 outside the pixel cooperatively form a source follower, and consequently, a voltage which varies in response to the voltage of the floating diffusion 115 is outputted to the vertical signal line 116.

The reset transistor 114 resets the potential of the floating diffusion 115 to a power supply potential Vdd. A wiring line for the power supply potential Vdd is common to all of the pixels.

Wiring lines 111A, 113A and 114A of the transfer transistor 111, selection transistor 113 and reset transistor 114 extend in a transverse direction (horizontal=row direction) so that those pixels which are included in the same row are driven simultaneously.

The transistors of the pixels are all NMOS transistors and are formed in a P-well region. A wiring line 118A for providing a contact 118 with the P-well region extends in a transverse direction (horizontal=row direction).

Figure 11:
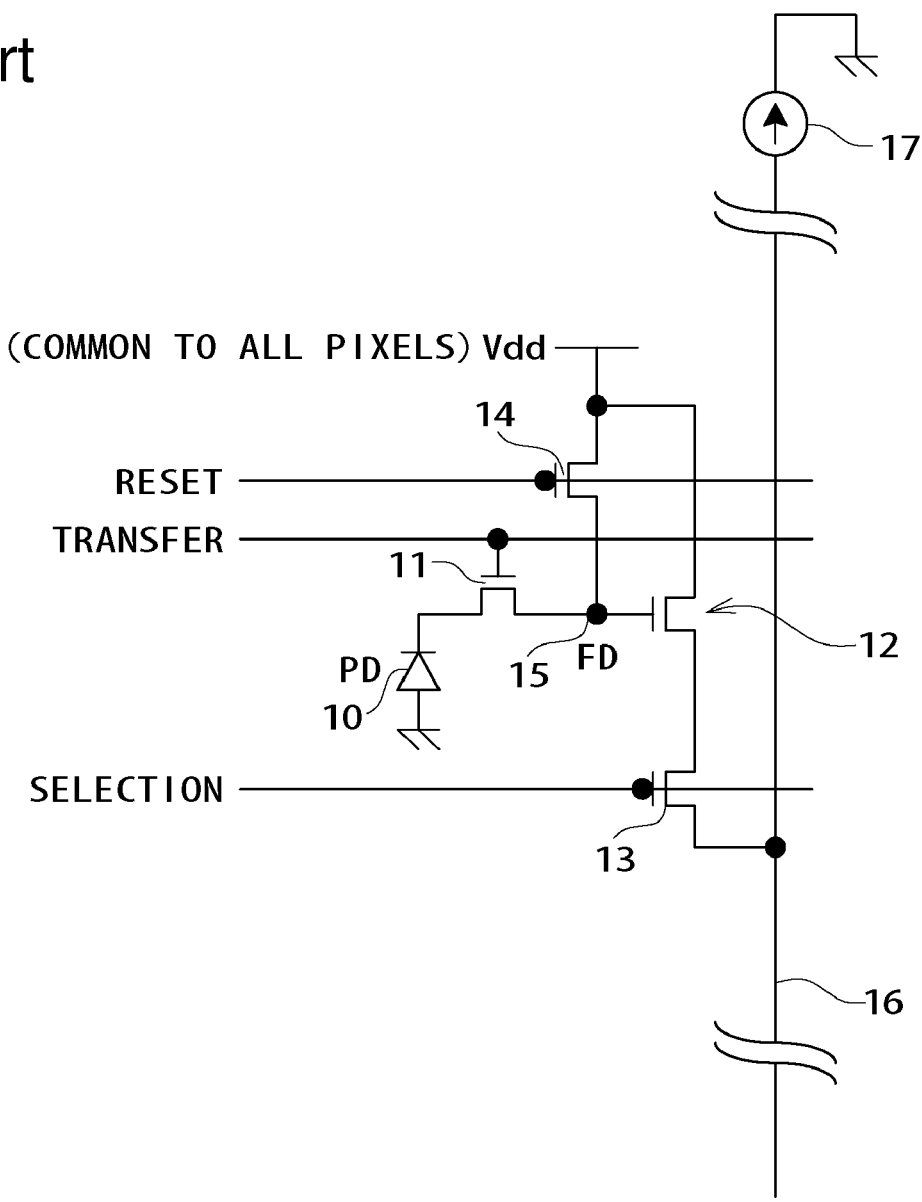
FIG. 11 is a circuit diagram showing an example of a pixel circuit of a conventional solid-state image pickup device.
Figure 1:
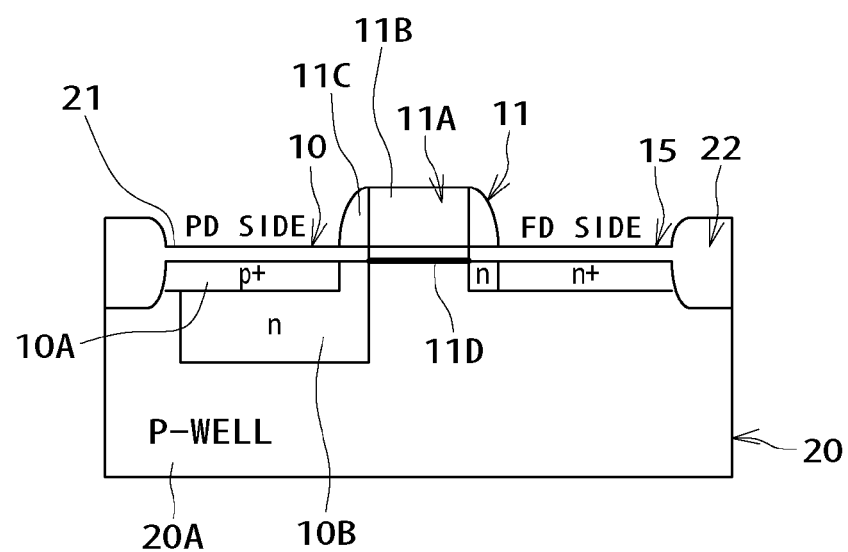

It is to be noted that, while it is more effective if the wiring lines 118A for providing the contacts 118 with the P-well regions are provided, where a high speed operation is not required or in a like case, even if the wiring lines 118A are not provided, the electric conductivity of the P-well regions themselves may be utilized to provide contacts with the P-well regions only around the pixel section to drive the pixel section. It is to be noted that the pixel circuit in this instance is similar to the conventional pixel circuit described hereinabove with reference to FIG. 11.

Now, a principle that the readout voltage from a photodiode in the solid-state image pickup device having such a configuration as described above can be reduced by applying a substrate bias synchronized with charge transfer to the P-well region below each pixel is described.

Figure 3:
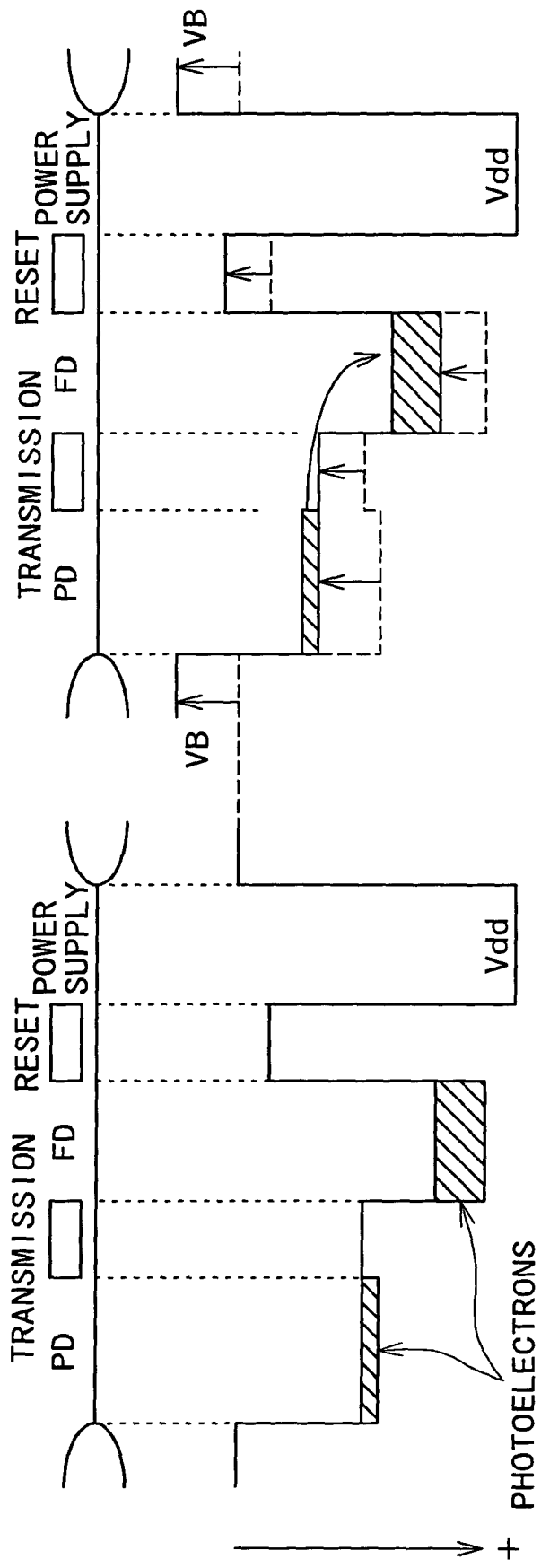
FIGS. 3A and 3B are diagrammatic views illustrating a structure of the potential in a region along a photodiode, a transfer gate, a floating diffusion, a reset gate and a power supply line of the solid-state image pickup device of FIG. 1 in comparison with that of a conventional solid-state image pickup device.

FIGS. 3A and 3B are diagrammatic views illustrating a structure of the potential in a region along the photodiode, transfer gate, floating diffusion, reset gate and power supply line Vdd of the solid-state image pickup device having such a configuration as described above. More particularly, FIG. 3A illustrates the potential when no substrate bias is applied (in a conventional transfer state), and FIG. 3B illustrates the potential when a substrate bias is applied (in the present embodiment). It is to be noted that the downward direction in FIGS. 3A and 3B is the positive direction of the potential.

In the conventional transfer state illustrated in FIG. 3A, the transfer gate or transistor 111 is turned on to transfer photoelectrons of the photodiode 119 to the floating diffusion 115. However, the voltage at the transfer gate 111 is not sufficient, and some photoelectrons remain in the photodiode 119 without being transferred.

In contrast, in the transfer state in the solid-state image pickup device of the present embodiment illustrated in FIG. 3B, the transfer gate 111 is turned on and a negative bias whose absolute value is VB is applied to the P-well region. At this time, since the capacitive coupling between the photodiode 119 and the P-well region is dominant, the potential at the photodiode 119 is deflected to the negative side by a value proximate to the substrate bias VB.

Meanwhile, since the channel in the layer below the transfer gate 111 is coupled strongly in a capacitive coupling to the transfer gate 111, the ratio of coupling between the channel and the P-well region is low, and consequently, the potential at the channel is deflected but by a value smaller than the substrate bias VB.

Further, since the floating diffusion 115 has a capacitive coupling to the transfer gate 111 and the reset gate or transistor 114 and further has a capacitive coupling through the amplification gate or transistor 112, the degree of coupling of the floating diffusion 115 to the P-well region is low. Consequently, the potential at the floating diffusion 115 is deflected but by a value smaller than the substrate bias VB.

The channel in the layer below the reset transistor 114 is similar to the channel in the layer below the transfer gate 111. At any node to which a fixed voltage such as the power supply voltage Vdd is applied, the potential does not vary.

Consequently, such a potential relationship as seen in FIG. 3B is obtained, and according to the potential relationship shown, photoelectrons of the photodiode 119 can be transferred to the floating diffusion 115. Due to this effect, even if the voltage at the transfer gate 111 is low, photoelectrons of the photodiode 119 can be transferred with certainty. Or, even if the transfer gate voltage is equal, photoelectrons of the photodiode 119 can be read out to a deeper potential, and consequently, the amount of handled charge increases and this expands the dynamic range.

Also it is possible to expand the dynamic range by a technique of varying the bias voltage to the P-well region within a storage period to lower the sensitivity where the light amount is comparatively great as hereinafter described in connection with a third example.

In the following, several examples of the embodiment of the present invention described above are described in detail.

First Example

First, a particular example wherein a substrate bias is applied to the P-well regions below the pixel section described above is described as a first example.

FIG. 4 is a plan view showing a configuration of the P-well regions below the pixel section according to the first example. Referring to FIG. 4, P-well regions 200 are indicated by slanting lines, and a blank portion between such P-well regions 200 indicates a P-well isolation region 210. Further, a square region in each of the P-well regions 200 indicates one pixel 110A.

In short, in the configuration shown in FIG. 4, the P-well regions 200 are provided in an electrically isolated relationship from each other along the individual pixel rows of the pixel section 110.

Figure 5:
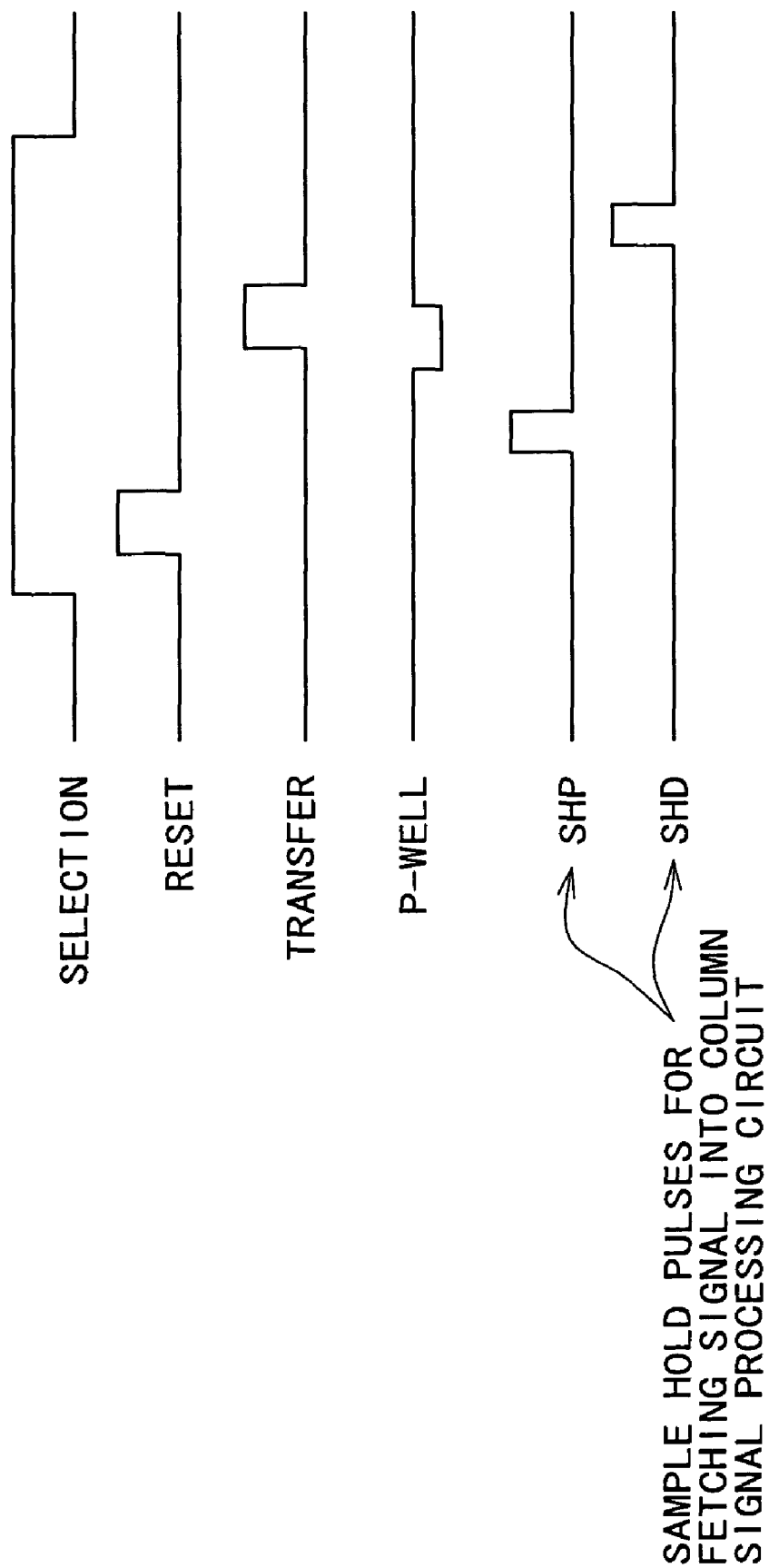
FIG. 5 is a timing chart illustrating driving pulses of the pixel circuit shown in FIG. 4.

FIG. 5 is a timing chart illustrating driving pulses applied to one of the pixel circuits in the first example.

Referring to FIG. 5, it is assumed that, as a prerequisite of the operation illustrated in the timing chart, the vertical selection driving section 140 selects a row from which pixel signals are to be outputted and supplies such pulses as seen in FIG. 5 to the row.

Further, two timing pulses SHP and SHD in FIG. 5 are inputted not to the pixel circuits of the row but to the column signal processing section 130 and are used to sample hold the outputs of the pixels.

Furthermore, it is assumed that, in each of the pixel circuits of the other non-selected rows, the transfer transistor 111, reset transistor 114 and selection transistor 113 are off and the P-well region 200 is held to 0 V.

In the following, operation in the selected row is described with reference to FIG. 5.

(1) First, the selection gates or transistors 113 are turned on. Consequently, signals of the row are permitted to be outputted to the vertical signal line 116.

(2) Then, a reset pulse is supplied to the reset gates or transistors 114 to reset the floating diffusions 115.

(3) Then, the voltages (reset levels) of the vertical signal lines 116 then are fetched into the column signal processing section 130 with the sample hold pulse SHP.

(4) Thereafter, a negative substrate bias is applied to the P-well regions 200 to turn on the transfer gates 111, and then the potentials of the P-well regions 200 are returned to 0 V to turn off the transfer gates 111. Consequently, photoelectrons are transferred to the floating diffusions 115. Here, the period after a transfer gate 111 is turned on until it is turned off is called transfer period.

(5) Then, the voltages (signal levels) of the vertical signal lines 116 then are fetched into the column signal processing section 130 with the sample hold pulse SHD.

(6) Then, the selection gates 113 are turned off to disconnect the row from the vertical signal lines 116.

Thereafter, the column signal processing section 130 detects the differences between the reset levels and the signal levels by means of the CDS circuit described hereinabove and performs other suitable processing for the difference signals, and then successively outputs resulting signals through the horizontal signal line 160.

In this manner, according to the present example, photoelectrons can be transferred with certainty even with a low voltage by applying a substrate bias upon charge transfer at the step (4) described above.

The vertical selection driving section 140 selects a next row after the column signal processing section 130 completes outputting of the signals to the horizontal signal line 160, and drives the newly selected row similarly. This is repeated to output the signals of the entire screen.

It is to be noted that, while it is described above that, in the present example, the column signal processing section 130 fetches signals with the pulses SHP and SHD, a different circuit which does not use such pulses may be used instead if the signals are fetched at the same timings. This similarly applies to the other examples described below.

Second Example

Now, an example wherein a substrate bias is applied to the P-well regions below the pixel section described above not in a unit of a row but over the overall pixel section is described as a second example.

Figure 6:
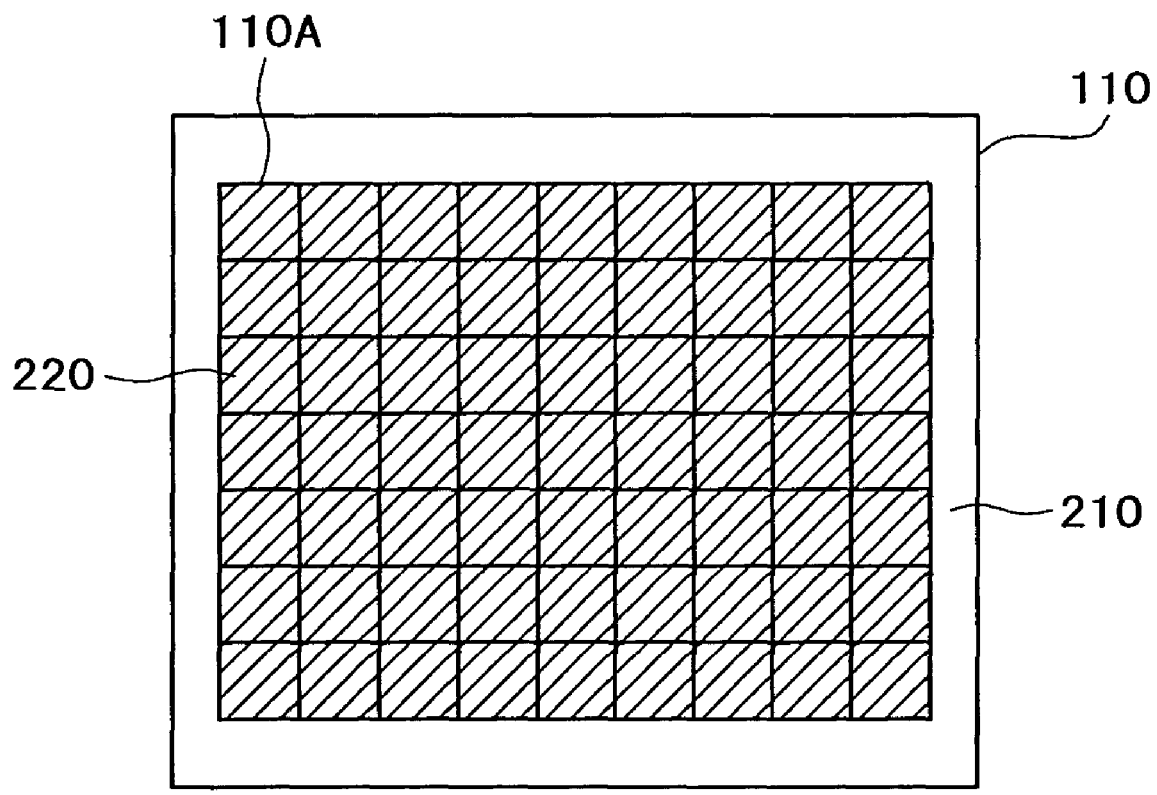
FIG. 6 is a schematic plan view showing a configuration of P-well regions below a pixel section according to a second example of the solid-state image pickup device of FIG. 1.

FIG. 6 is a plan view showing a configuration of the P-well regions below the pixel section in the second example, and in FIG. 6, P-well regions 220 are indicated by slanting lines. In particular, in the present example, electrically conducting P-well regions 220 are provided over the overall area of the pixel section 110.

Figure 7:
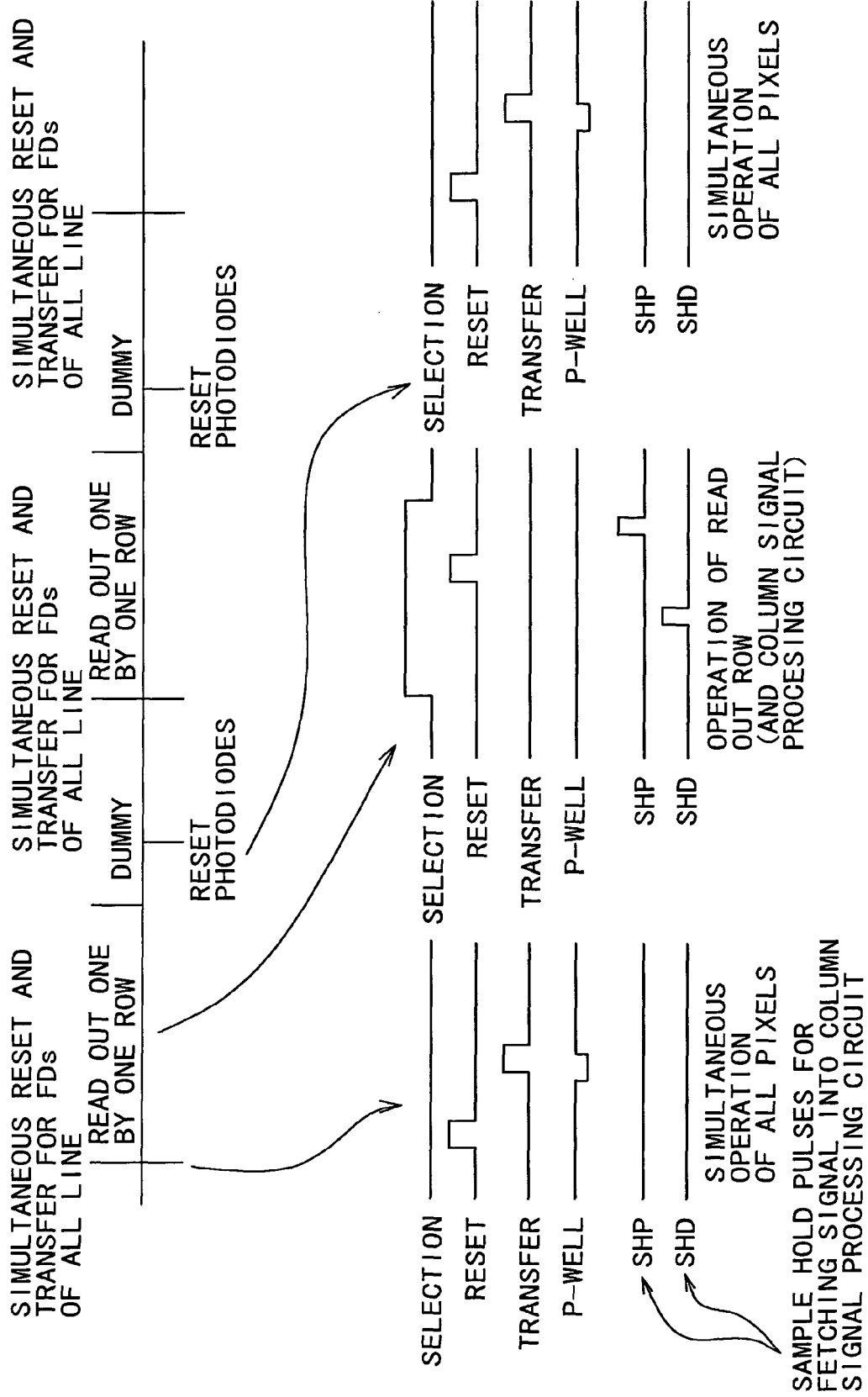
FIG. 7 is a timing chart illustrating driving pulses of the pixel circuit shown in FIG. 6.

FIG. 7 is a timing chart illustrating driving pulses to be applied to a pixel circuit in the second example.

First, the pixels in all of the rows are rendered operative at the same time, and transfer of charge is performed next to resetting of the floating diffusions 115. In particular, a reset pulse is applied first to reset the floating diffusions 115. Thereafter, a transfer pulse is applied to transfer photoelectrons of the photodiodes 119 to the floating diffusions 115.

At the timing of the transfer pulse, the potential of each P-well region 220 is deflected to a negative value to assist the transfer similarly as in the first example. Consequently, the floating diffusions 115 in all of the pixels hold voltages shifted by potentials corresponding to the photoelectrons from the voltages upon resetting.

Thereafter, the signals of the pixels are read out one by one row. Here, the pixels only in the readout row operate.

In the readout row, the selection transistors 113 are turned on first, and the voltages (signal levels) of the vertical signal lines 116 in this state are fetched into the column signal processing section 130 with the sample hold pulse SHD.

Then, a reset pulse is applied to fetch the voltages (reset levels) of the vertical signal lines 116 into the column signal processing section 130 with the sample hold pulse SHP. Thereafter, the selection transistors 113 are turned off.

The column signal processing section 130 detects the differences between the reset levels and the signal levels and performs suitable processing for the difference signals, and successively outputs resulting signals through the vertical selection driving section 140 after the selection transistors 113 are turned off.

Thereafter, the readout row is shifted to a next row to repetitively execute a similar operation.

Then, after the signals of all of the rows are successively read out one by one row in this manner, a period of dummy signals continues till an end of a one-frame period. Within the period, a resetting operation for a photodiode for determining the sensitization period is placed. This operation is performed for the pixels of all of the rows.

It is to be noted that the operation just described may be a same operation as the simultaneous resetting and transferring operations for the floating diffusions of all rows described above, and upon the transfer, a negative potential is applied to the P-well region 220 to assist the transfer. After this point of time, new photoelectrons begin to be stored into the photodiode, and a similar operation is performed from the beginning.

It is to be noted that, while, in the first and second examples described above, a photodiode is used as a photoelectric conversion element, it does not matter whether or not the photodiode is of the embedded type. Or, even where a photogate is used instead, the same effect that a substrate bias facilitates transfer can be anticipated.

Third Example

Now, an example wherein the bias voltage to each P-well region below the pixel section described above is varied intermediately within a charge storage period to expand the dynamic range is described as a third example.

Figure 8:
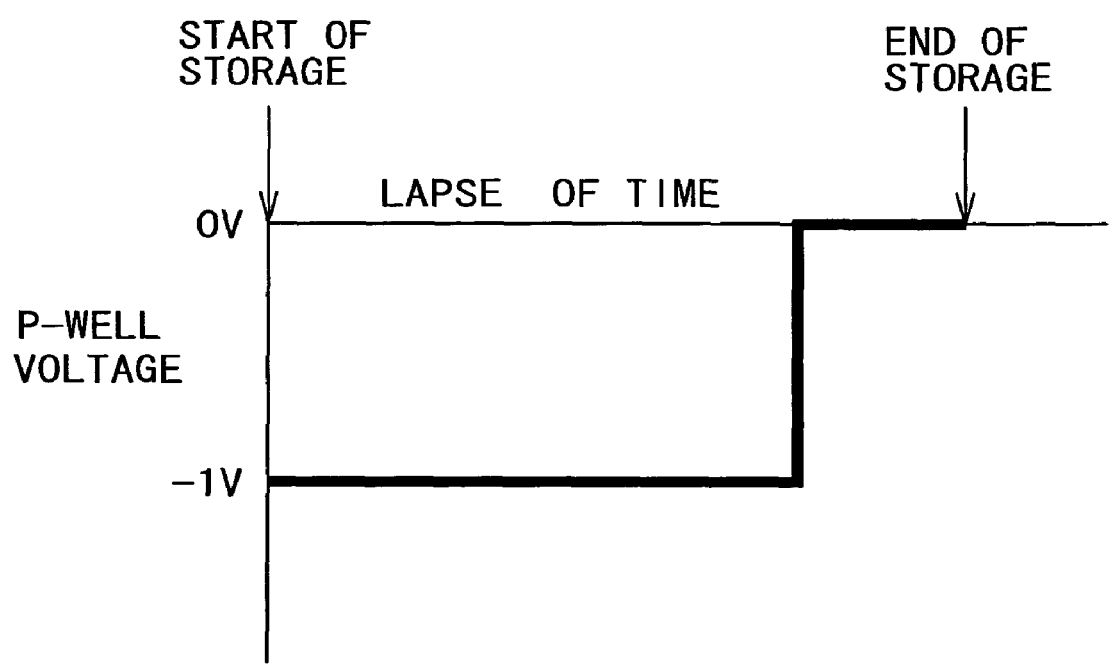
FIG. 8 is a timing chart illustrating an example of operation for changing the bias voltage to a P-well region according to a third example of the solid-state image pickup device of FIG. 1.
Figure 9:
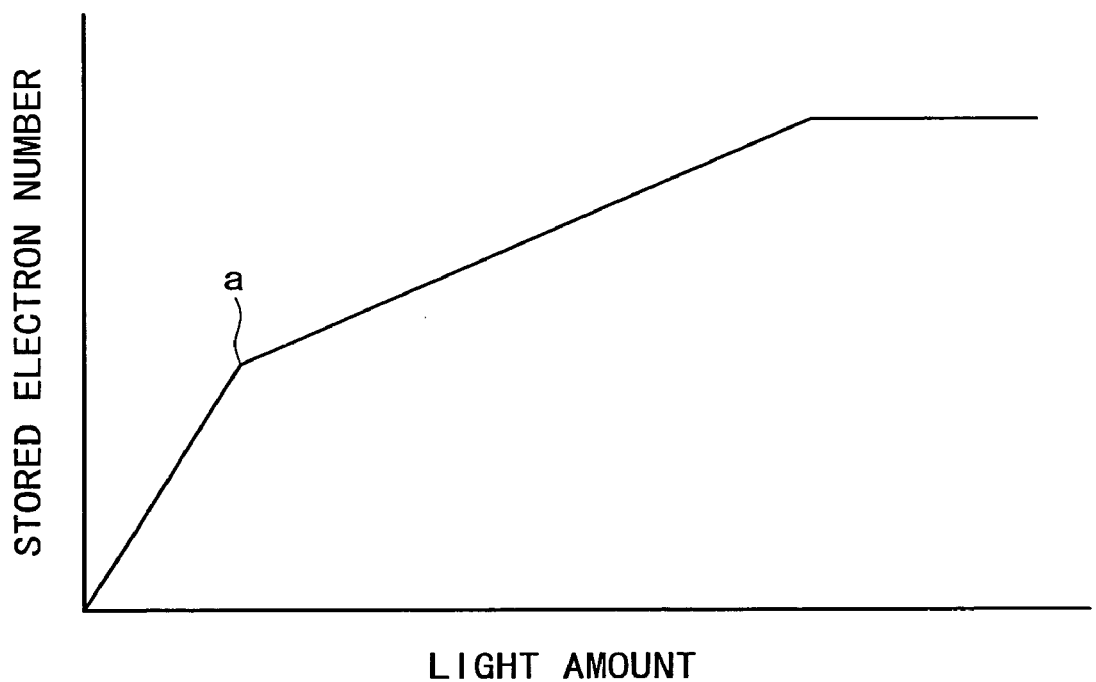
FIG. 9 is a diagram illustrating a relationship between the amount of received light and the number of stored electrons of a photodiode upon the operation illustrated in FIG. 8.

FIG. 8 is a timing chart illustrating an example of operation where the bias voltage to a P-well region is varied intermediately within a charge storage period, and the axis of ordinate indicates the P-well voltage and the axis of abscissa indicates lapse of time. Meanwhile, FIG. 9 is a diagram illustrating a relationship between the amount of received light and the number of stored electrons of a photodiode in the operation illustrated in FIG. 8.

When storage of photoelectrons into a photodiode is started, the P-well voltage is set to, for example, −1 V as seen in FIG. 8. If the P-well voltage is changed to 0 V intermediately within the storage period, then, as seen in FIG. 9, where the light amount is small, the number of stored electrons into the photodiode varies sensitively, but where the light amount is great, the number of stored electrons into the photodiode varies insensitively.

The reason is such as follows. In particular, when the P-well region is biased to −1 V, the saturation amount of the photodiode is small, and after the photodiode is saturated with a certain number of electrons, further electrons flow out to the floating diffusion.

Here, if the P-well region is biased now to 0 V, then the saturation amount of the photodiode increases, and therefore, the photodiode can store further photoelectrons.

When the light amount is small, photoelectrons for the full storage period are collected without saturating the photodiode. However, when the light amount is great, electrons exceeding the saturation amount are abandoned within the period within which the P-well region is biased to −1 V, and therefore, the sensitivity drops as much.

Consequently, a sensitivity curve which has a bent point "a" at a certain portion thereof as seen in FIG. 9 is obtained. Thus, the amount of light which can be detected can be increased without sacrificing the sensitivity where the brightness is low. In other words, the dynamic range is expanded.

It is to be noted that, while, in the example illustrated in FIG. 8, the P-well voltage is varied between two values of −1 V and 0 V, if it is otherwise varied more finely like −1 V to −0.5 V to 0 V, then the number of bent points on the sensitivity curve can be increased. If this is combined with suitable setting of the variation time of the voltage, then various sensitivity curves can be obtained.

On the other hand, if the P-well voltage is otherwise varied continuously, then not such a polygonal line as seen in FIG. 9 but a curved line is obtained as the sensitive curve.

Where such a method as described above is used, both of the problems of the method disclosed in the patent document 1 described hereinabove can be solved. In particular, not only the problem that there is a limitation to the range of operation where the voltage to the transfer gate is varied but also the problem that the dark current is high where the voltage to the reset gate is varied can be solved.

It is to be noted that the method of the third example is independent of those of the first and second examples described hereinabove. In other words, the method of the third example is independent of application of a substrate bias upon transfer. Naturally, it is possible to carry out the method together with the configuration of the first or second example.

Further, while a photodiode is used here as a photoelectric conversion element, also where a photogate is used, a substrate bias can be used to decrease the saturation to achieve a similar effect.

Furthermore, while the third example is applied to a pixel circuit which includes a photodiode, a transfer gate and a floating diffusion, a quite similar effect can be achieved also with another pixel circuit which does not include a transfer gate and a floating diffusion but only includes a photodiode which is connected directly to an amplification gate. This is because not a transfer gate but a reset gate determines the saturation of the photodiode and the substrate bias decreases the saturation of the photodiode.

It is to be noted that, while the examples described above use an electron as the carrier and use an NMOS pixel transistor as a basic element, it is apparent that it is possible to use a hole as the carrier and use a PMOS pixel transistor as a basic element. In this instance, also the polarity of the voltage and so forth vary accordingly.

Further, the configuration of the pixel transistor is not limited to the example described above, but various configurations may be adopted.

Furthermore, the present invention can be applied not only to a CMOS type solid-state image pickup device but also to a CCD type solid-state image pickup device.

In particular, a CCD type solid-state image pickup device includes, for example, a plurality of CCD vertical transfer registers provided for each of pixel columns arranged in a two-dimensional array and a CCD horizontal transfer register provided at end portions of the CCD vertical transfer registers. Signal charge accumulated in the pixels is successively transferred by the transfer registers, and then, the signal charge is converted into and outputted as an electric signal by a floating diffusion provided at the terminal end of the CCD horizontal transfer register. If a substrate bias described hereinabove is applied to the well region of such a CCD type solid-state image pickup device as described above, then the gate voltage used to read out signal charge from the photodiode of each pixel to the charge storage portion of a corresponding one of the CCD vertical transfer registers through a corresponding readout gate can be lowered.

Figure 10:
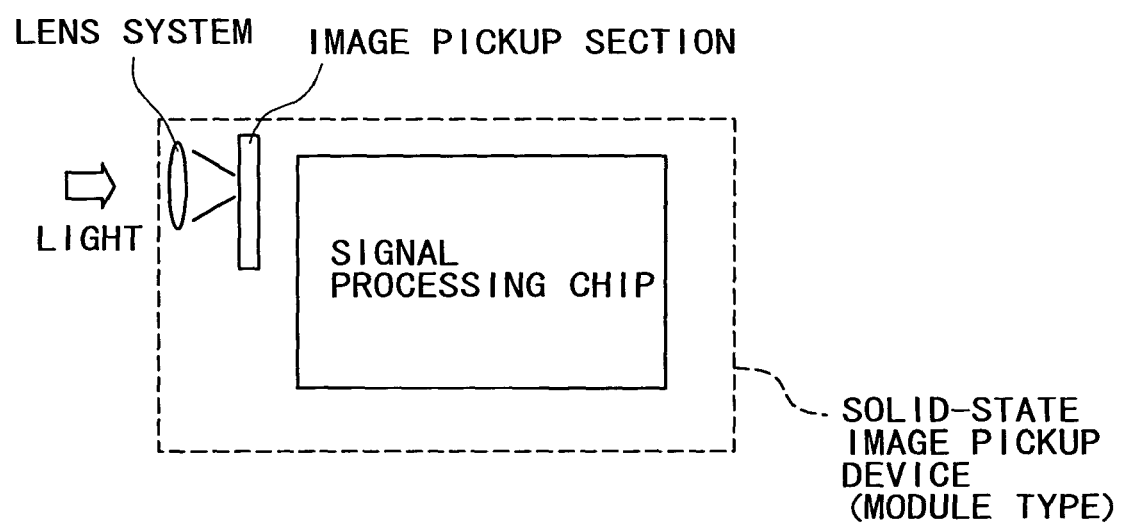
FIG. 10 is a schematic diagrammatic view showing an example of a general configuration of a solid-state image pickup device of the module type to which the present invention is applied.

Further, the solid-state image pickup device may be of a module type including a signal processing chip and/or a lens system and incorporated in an electric apparatus as seen in FIG. 10.

In the solid-state image pickup device and the driving method therefor according to the present invention, when signal charge produced by the photoelectric conversion element is to be read out by the readout section, a predetermined substrate bias voltage is applied to the well region. Consequently, although the potentials at the photoelectric conversion element and the readout section are deflected by a potential variation in the well region, the deflection amount of the potential at the readout section is suppressed due to the presence of the bias voltage in the well region, and the deflection amount at the photoelectric conversion element becomes greater than that at the readout section.

As a result, even where the readout voltage is low, the signal charge of the photoelectric conversion element can be transferred efficiently to the readout section side, and consequently, reduction of the readout voltage can be achieved. Or, where the voltage is equal, a greater amount of charge can be read out. Consequently, increase of the charge amount to be handled and expansion of the dynamic range can be achieved.

Further, with the solid-state image pickup device and the driving method therefor according to the present invention, the substrate bias voltage to be applied to the well region is changed within a storage period of signal charge by the photoelectric conversion element to change over the saturation electron number of the photoelectric conversion element so as to increase as time passes. Consequently, the saturation of the photoelectric conversion element in a bright region can be prevented while the sensitivity in a dark region is not deteriorated, and as a result, the dynamic range can be expanded.

While a preferred embodiment of the present invention has been described using specific terms, such description is for illustrative purposes only, and it is to be understood that changes and variations may be made without departing from the spirit or scope of the following claims.

What is claimed is:

1. A complementary metal-oxide semiconductor type solid-state image pickup device, comprising:
    a semiconductor substrate having a plurality of well regions formed thereon; and
    a pixel unit having a plurality of pixels in a plurality of pixel rows on the semiconductor substrate, each pixel in a pixel row of said plurality of pixel rows including
        (a) a photoelectric conversion element formed in a well region of said plurality of well regions to receive light and produce a signal charge in accordance with an amount of the received light;
        (b) a readout section formed in said well region to read out the signal charge produced by said photoelectric conversion element at a predetermined readout timing;
        (c) a node connected to the photoelectric conversion element through the readout section, and
        (d) a voltage control unit to apply a variable substrate bias voltage to said well region dependent upon the read out of the signal charge by said readout section,
    wherein the well regions of the plurality of well regions are electrically isolated from each other along each pixel row of the plurality of pixel rows, and
    wherein the voltage control unit varies the variable substrate bias voltage to said well region while the readout section reads out the signal charge.

2. The complementary metal-oxide semiconductor type solid-state image pickup device according to claim 1, wherein said plurality of pixels is arranged in a two-dimensional array on said semiconductor substrate.

3. The complementary metal-oxide semiconductor type solid-state image pickup device according to claim 2, wherein an independent substrate bias voltage is applied to each well region of the plurality of well regions plurality of rows.

4. The complementary metal-oxide semiconductor type solid-state image pickup device according to claim 1, wherein each well region of said plurality of well regions is a p-type well region and the substrate bias voltage is a negative voltage.

5. The complementary metal-oxide semiconductor type solid-state image pickup device according to claim 1, wherein each pixel of said solid-state image pickup device also includes a pixel transistor connected to said photoelectric conversion element through said node for converting the signal charge read out from said photoelectric conversion element into an electric signal and outputting the electric signal to a signal line.

6. The complementary metal-oxide semiconductor type solid-state image pickup device according to claim 1, wherein each well region of the plurality of well regions includes a plurality of pixels.

7. A complementary metal-oxide semiconductor type solid-state image pickup device, comprising:
- a semiconductor substrate having a plurality of well regions formed thereon; and
- a pixel unit having a plurality of pixels in a plurality of pixel rows on the semiconductor substrate, each pixel in a pixel row of said plurality of pixel rows including
  - (a) a photoelectric conversion element formed in a well region of said plurality of well regions to receive light and produce a signal charge in accordance with an amount of the received light;
  - (b) a readout section formed in said well region to read out the signal charge produced by said photoelectric conversion element at a predetermined readout timing;
  - (c) a node connected to the photoelectric conversion element through the readout section, and
  - (d) voltage control means to apply a substrate bias voltage to said well region and change the substrate bias voltage during a storage period of the signal charge by said photoelectric conversion element,
  - wherein the well regions of the plurality of well regions are electrically isolated from each other along each pixel row of the plurality of pixel rows, and
- wherein the voltage control means varies the substrate bias voltage to said well region while the readout section reads out the signal charge.

8. The complementary metal-oxide semiconductor type solid-state image pickup device according to claim 7, wherein said plurality of pixels is arranged in a two-dimensional array on said semiconductor substrate.

9. The complementary metal-oxide semiconductor type solid-state image pickup device according to claim 8, wherein an independent substrate bias voltage is applied to each well region of the plurality of well regions.

10. The complementary metal-oxide semiconductor type solid-state image pickup device according to claim 7, wherein each well region of said plurality of well regions is a p-type well region and the substrate bias voltage is a negative voltage.

11. The complementary metal-oxide semiconductor type solid-state image pickup device according to claim 7, wherein each pixel of said plurality of pixels also includes a pixel transistor connected to said photoelectric conversion element through said node for converting the signal charge read out from said photoelectric conversion element into an electric signal and outputting the electric signal to a signal line.

12. A method to drive a solid-state image pickup device including (a) a semiconductor substrate having a plurality of well regions formed thereon; and (b) a pixel unit including a plurality of pixels in a plurality of pixel rows on the semiconductor substrate, each pixel in a pixel row of said plurality of pixel rows including (i) a photoelectric conversion element formed in a well region of said plurality of well regions to receive light and produce a signal charge in accordance with an amount of the received light, (ii) a readout section formed in said well region to read out the signal charge produced by said photoelectric conversion element at a predetermined readout timing, (iii) a node connected to the photoelectric conversion element through the readout section, and (iv) voltage control means to apply a substrate bias voltage to said well region and change the substrate bias voltage during a storage period of the signal charge by said photoelectric conversion element, said method comprising the steps of:
- converting light to the signal charge;
- storing said signal charge during the storage period; and
- varying the substrate bias voltage to said well region while said readout section reads out the signal charge during a readout period,
- wherein the well regions of the plurality of well regions are electrically isolated from each other along each pixel row of the plurality of pixel rows.

13. The method to drive a solid-state image pickup device according to claim 12, wherein said photoelectric conversion element is provided for each pixel of said plurality of pixels, and said plurality of pixels is formed in a two-dimensional array on said semiconductor substrate.

14. The method to drive a solid-state image pickup device according to claim 13, wherein an independent substrate bias voltage is applied to each well region of the plurality of well regions.

15. The method to drive a solid-state image pickup device according to claim 12, wherein each well region of said plurality of well regions is a p-type well region and the substrate bias voltage is a negative voltage.

16. A method for driving a complementary metal-oxide semiconductor type solid-state image pickup device including (a) a semiconductor substrate having a plurality of well regions formed thereon; and (b) a pixel unit including a plurality of pixels in a plurality of pixel rows on the semiconductor substrate, each pixel in a pixel row of said plurality of pixel rows including (i) a photoelectric conversion element formed in a well region of said plurality of well regions to receive light and produce a signal charge in accordance with an amount of the received light, (ii) a readout section formed in said well region to read out the signal charge produced by said photoelectric conversion element at a predetermined readout timing, (iii) a node connected to the photoelectric conversion element through the readout section, and (iv) voltage control means to apply a substrate bias voltage to said well region and change the substrate bias voltage during a storage period of the signal charge by said photoelectric conversion element, said method comprising the steps of:
- converting light to the signal charge;
- storing said signal charge during the storage period; and
- varying the substrate bias voltage to said well region while said readout section reads out the signal charge and changing the substrate bias voltage during said storage period of the signal charge by said photoelectric conversion element,
- wherein the well regions of the plurality of well regions are electrically isolated from each other along each pixel row of the plurality of pixel rows.

17. The method for driving a complementary metal-oxide semiconductor type solid-state image pickup device according to claim 16, wherein said photoelectric conversion element is provided for each pixel of said plurality of pixels, and said plurality of pixels is formed in a two-dimensional array on said semiconductor substrate.

18. The method for driving a complementary metal-oxide semiconductor type solid-state image pickup device according to claim 16, further comprising:
- reducing a readout voltage by applying the substrate bias voltage synchronized with charge transfer.

* * * * *